(12) United States Patent
Nozu

(10) Patent No.: US 8,599,894 B2
(45) Date of Patent: Dec. 3, 2013

(54) SEMICONDUCTOR LASER MANUFACTURING METHOD AND SEMICONDUCTOR LASER

(75) Inventor: Shunsuke Nozu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/482,606

(22) Filed: May 29, 2012

(65) Prior Publication Data

US 2012/0307854 A1 Dec. 6, 2012

(30) Foreign Application Priority Data

May 31, 2011 (JP) ................... 2011-121541

(51) Int. Cl.
*H01S 5/00* (2006.01)
(52) U.S. Cl.
USPC .................. 372/45.01; 372/46.01; 372/44.01; 372/43.01; 438/46
(58) Field of Classification Search
USPC ......... 372/45.01, 46.01, 44.01, 43.01; 438/46
See application file for complete search history.

(56) References Cited

U.S. PATENT DOCUMENTS

| 5,987,048 A * | 11/1999 | Ishikawa et al. ........... 372/46.01 |
| 6,735,230 B1 * | 5/2004 | Tanabe et al. .............. 372/43.01 |
| 6,841,410 B2 | 1/2005 | Sasaoka |

FOREIGN PATENT DOCUMENTS

| JP | 2003-78215 A | 3/2003 |
| JP | 2007-250637 A | 9/2007 |

* cited by examiner

*Primary Examiner* — Kinam Park
(74) *Attorney, Agent, or Firm* — Foley & Lardner LLP

(57) ABSTRACT

Provided are a semiconductor laser manufacturing method and a semiconductor laser with a low device resistance. First, an active layer is deposited above a GaN substrate of a first conductivity type. A first guide layer made of GaN of a second conductivity type is deposited above the active layer. An AlN layer is deposited on the first guide layer. An opening is formed in the AlN layer. A first cladding layer made of a group-III nitride semiconductor of the second conductivity type is formed on the AlN layer and the first guide layer exposed through the opening such that a first growth rate at a start of growth on the first guide layer exposed through the opening becomes greater than a second growth rate at a start of growth on the AlN layer. A contact layer of the second conductivity type is formed on the first cladding layer.

13 Claims, 8 Drawing Sheets

SEMICONDUCTOR LASER MANUFACTURING METHOD AND SEMICONDUCTOR LASER

CROSS-REFERENCE TO RELATED APPLICATIONS

This application is based upon and claims the benefit of priority from Japanese patent application No. 2011-121541, filed on May 31, 2011, the disclosure of which is incorporated herein in its entirety by reference.

BACKGROUND

The present invention relates to a semiconductor laser manufacturing method and a semiconductor laser, and more particularly, to a semiconductor laser manufacturing method and a semiconductor laser with a low device resistance.

In recent years, semiconductor lasers are used in the field of optical pickup. In particular, to achieve high-density recording, semiconductor lasers having a short luminous wavelength and using a group-III nitride semiconductor are in widespread use (Japanese Unexamined Patent Application Publication Nos. 2003-78215 and 2007-250637).

As an example of semiconductor lasers using a group-III nitride semiconductor, a semiconductor laser 300 disclosed in Japanese Unexamined Patent Application Publication No. 2003-78215 will be described. The semiconductor laser 300 is an inner stripe type light-emitting device using an AlN layer as a current constriction layer. FIG. 4 is a sectional view showing the configuration of the semiconductor laser 300.

The semiconductor laser 300 has a configuration in which an Si-doped n-type GaN layer 302 (Si concentration: $4\times10^{17}$ $cm^{-3}$; thickness: 1 μm), an n-type cladding layer 303, an n-type guide layer 304, a 3-period multiple quantum well (MQW) layer 305, a cap layer 306, and a p-type GaN guide layer 307 are stacked on an n-type GaN substrate 301. The n-type cladding layer 303 is made of Si-doped n-type $Al_{0.1}Ga_{0.9}N$ (Si concentration: $4\times10^{17}$ $cm^{-3}$; thickness 2 μm). The n-type guide layer 304 is made of Si-doped n-type GaN (Si concentration: $4\times10^{17}$ $cm^{-3}$; thickness: 0.1 μm). The 3-period multiple quantum well (MQW) layer 305 is composed of an $In_{0.15}Ga_{0.85}N$ (thickness: 3 nm) well layer and an Si-doped $In_{0.01}Ga_{0.99}N$ (Si concentration: $1\times10^{18}$ $cm^{-3}$; thickness: 4 nm) barrier layer. The cap layer 306 is made of Mg-doped p-type $Al_{0.2}Ga_{0.8}N$. The p-type GaN guide layer 307 is made of Mg-doped p-type GaN (Mg concentration: $2\times10^{19}$ $cm^{-3}$; thickness: 0.1 μm).

A current constriction layer 308, a p-type cladding layer 309, and a contact layer 310 are stacked on the p-type GaN guide layer 307. The p-type cladding layer 309 is made of Mg-doped p-type $Al_{0.1}Ga_{0.9}N$ (Mg concentration: $1\times10^{10}$ $cm^{-3}$; thickness 0.5 μm). The contact layer 310 is made of Mg-doped p-type GaN (Mg concentration: $1\times10^{20}$ $cm^{-3}$; thickness 0.02 μm). A p-type electrode 311 and an n-type electrode 312 are formed on and below this stacked structure.

Next, a method for manufacturing the stacked structure of the semiconductor laser 300 will be described. First, the n-type GaN substrate 301 is put in a growth system, and the temperature of the substrate is then increased while supplying $NH_3$. When the temperature reaches a growth temperature, a first crystal growth is started. In the first crystal growth, the Si-doped n-type GaN layer 302, the n-type cladding layer 303, the n-type guide layer 304, the 3-period multiple quantum well (MQW) layer 305, the cap layer 306, and the p-type GaN guide layer 307 are sequentially deposited. After that, the substrate temperature is decreased to a predetermined temperature, and a low temperature AlN layer is deposited. After the first crystal growth is finished, an opening 308a is formed in the low temperature AlN layer by photolithography and etching, to thereby form the current constriction layer 308.

After that, a second crystal growth is carried out. In the second crystal growth, the substrate temperature is increased to a growth temperature of 1100° C. with an $NH_3$ feed rate of 0.36 mol/min, and the p-type cladding layer 309 is deposited. Then, the substrate temperature is decreased to 1080° C. and the contact layer 310 is deposited.

The low temperature AlN layer forming the current constriction layer 308 is formed in an amorphous state by the first crystal growth. Accordingly, the opening 308a can be easily formed in the low temperature AlN layer by wet etching to obtain the current constriction layer 308. The current constriction layer 308 is heated at a high temperature in the second crystal growth, and is crystallized by solid-phase growth by inheriting the crystal orientation of the GaN layer formed below the current constriction layer 308.

In the second crystal growth, the crystal growth progresses also from the surface of the crystallized current constriction layer 308, so that an even embedded shape can be obtained. When GaN or AlGaN having a low Al composition is formed on the crystallized current constriction layer 308, dislocations occur at a high density of $5\times10^{10}$ to $1\times10^{12}$ $cm^{-2}$ due to a difference in lattice constant. The high-density dislocations alleviate a lattice strain in the current constriction layer 308, thereby obtaining an even surface with no cracks or pits.

In the inner stripe type semiconductor laser like the semiconductor laser 300, the contact width of the p-type electrode 311 can be set to be greater than the width of the opening 308a of the current constriction layer 308. Accordingly, also in the semiconductor laser provided with the opening 308a having a narrow width of 1 to 2 um for allowing a horizontal mode control, a low contact resistance is obtained, and thus a semiconductor laser with a low device resistance can be achieved.

Additionally, Japanese Unexamined Patent Application Publication No. 2007-250637 proposes a group-III nitride semiconductor light-emitting device that prevents deterioration in laser characteristics by preventing a cleavage failure from reaching the active layer.

SUMMARY

After a review of the semiconductor laser 300, however, the present inventor has found that there is room for lowering a device resistance as described below. Specifically, the inventor has found that in the inner stripe type semiconductor laser 300, the contact width of the p-type electrode 311 can be set to be greater than the width of the narrow opening 308a, but only a narrow region effectively function as a contact.

In the semiconductor laser 300, the p-type cladding layer 309 formed by crystal growth on the current constriction layer 308 has dislocations at a high density. FIG. 5 is an enlarged sectional view of an internal portion enclosed by a dashed box 320 shown in FIG. 4. FIG. 5 is based on the analysis provided by the inventor. As shown in FIG. 5, dislocations 313 are propagated upward from an upper portion of the current constriction layer 308 through the p-type cladding layer 309. On the other hand, the region immediately above the opening 308a inherits the dislocation density of the substrate. Accordingly, the dislocation density is lower than that of the region immediately above the current constriction layer 308. As a result, the p-type cladding layer 309 in the region immediately above the current constriction layer 308 has a resistance higher than that of the p-type cladding layer 309 in the region immediately above the opening 308a.

For this reason, the p-type cladding layer 309 in the region immediately above the opening 308a, which serves as a low dislocation density region, functions as a main current path. Accordingly, even when the p-type electrode 311 is formed to be greater than the width of the opening 308a, only a region equivalent to the opening 308a actually functions as a contact. As a result, the effect of reducing the contact resistance is insufficient even when the inner stripe structure is employed.

A first aspect of the present invention is a semiconductor laser manufacturing method including: depositing an active layer above a GaN substrate of a first conductivity type; depositing a first guide layer above the active layer, the first guide layer being made of GaN of a second conductivity type different from the first conductivity type; depositing an AlN layer on the first guide layer; forming an opening in the AlN layer; forming a first cladding layer on the AlN layer and the first guide layer exposed through the opening such that a first growth rate at a start of growth on the first guide layer exposed through the opening is greater than a second growth rate at a start of growth on the AlN layer, the first cladding layer being made of a group-III nitride semiconductor of the second conductivity type; and forming a contact layer of the second conductivity type on the first cladding layer. According to the semiconductor laser manufacturing method, a low dislocation density region can be formed in each of the first cladding layer and the contact layer above the opening, and the width at the upper surface of the contact layer in the low dislocation density region can be set to be greater than the width at the opening. This contributes to a reduction in contact resistance of the semiconductor laser.

Another aspect of the present invention is a semiconductor laser including: an active layer that is deposited above a GaN substrate of a first conductivity type; a first guide layer that is deposited above the active layer and made of GaN of a second conductivity type different from the first conductivity type; a current constriction layer that is deposited on the first guide layer and having an opening; a first cladding layer that is deposited on the current constriction layer and the first guide layer exposed through the opening, the first cladding layer being made of a group-III nitride semiconductor of the second conductivity type; and a contact layer of the second conductivity type that is formed on the first cladding layer. The first cladding layer and the contact layer include: a first region that is formed above the current constriction layer and having a threading dislocation extending from the current constriction layer toward an upper surface of the contact layer; and a second region that is formed above the first guide layer exposed through the opening, the second region having a threading dislocation extending from the first guide layer toward the upper surface of the contact layer at a density lower than that of the first region, a width of the second region at the upper surface of the contact layer being greater than a width of the opening. In the semiconductor laser, a low dislocation density region is formed in each of the first cladding layer and the contact layer above the opening, and the width at the upper surface of the contact layer in the low dislocation density region is set to be greater than the width at the opening. This contributes to a reduction in contact resistance of the semiconductor laser.

According to exemplary aspects of the present invention, it is possible to provide a semiconductor laser manufacturing method and a semiconductor laser with a low device resistance.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
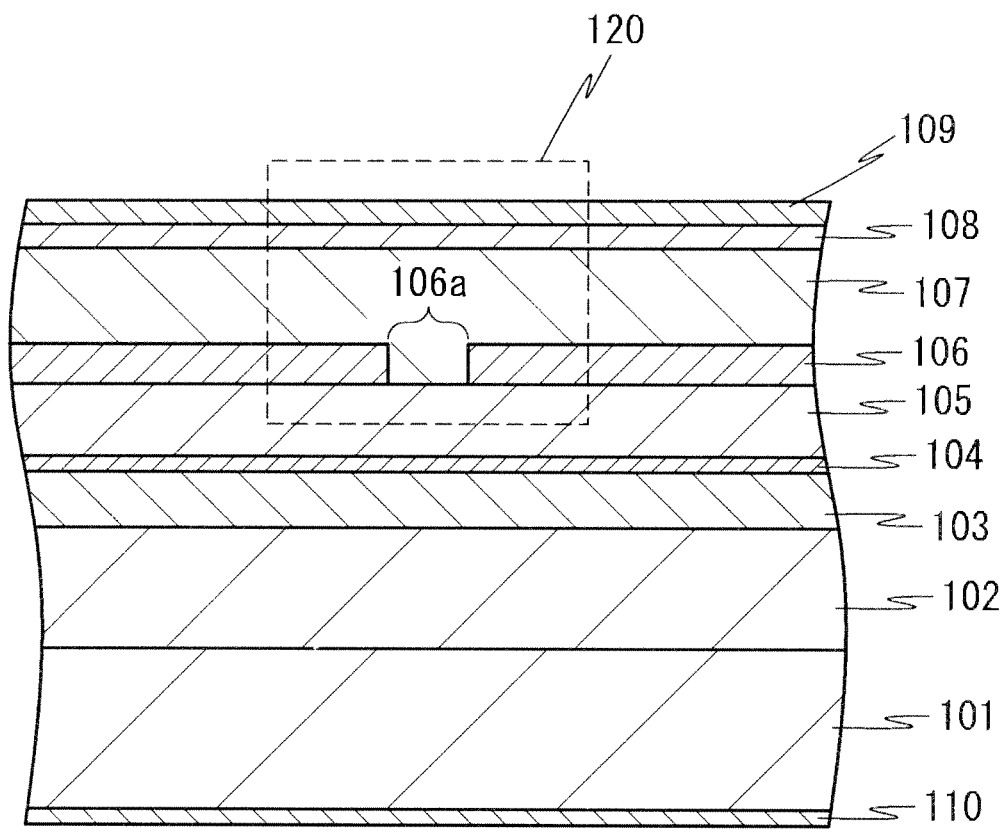
FIG. 1 is a sectional view schematically showing a configuration of a semiconductor laser 100 according to a first embodiment.

Hereinafter, an embodiment of the present invention will be described with reference to the drawings. In the drawings, the same components are denoted by the same reference numerals, and a repeated explanation is omitted as needed.

First Embodiment

A semiconductor laser 100 according to a first embodiment of the present invention will be described. FIG. 1 is a sectional view schematically showing the configuration of the semiconductor laser 100 according to the first embodiment. The semiconductor laser 100 has a configuration in which an n-type cladding layer 102, an n-type GaN guide layer 103, an active layer 104, a p-type GaN guide layer 105, a current constriction layer 106 having an opening 106a, a p-type cladding layer 107, and a p-type contact layer 108 are stacked in this order on an n-type GaN substrate 101. A p-type electrode 109 is formed on the p-type contact layer 108, and an n-type electrode 110 is formed on the back surface of the n-type GaN substrate 101.

Specific examples of the n-type GaN substrate 101 and the layers stacked thereon will be given below. The n-type GaN substrate 101 is a free-standing GaN substrate having a thickness of 300 μm and a substrate dislocation density of $5 \times 10^6$ cm$^{-1}$, for example. The n-type cladding layer 102 is made of Si-doped n-type $Al_{0.1}Ga_{0.9}N$ with an Si concentration of $4 \times 10^{17}$ cm$^{-3}$ and a thickness of 2 μm. The n-type GaN guide layer 103 is made of Si-doped n-type GaN with an Si concentration of $4\times10^{17}$ cm$^{-3}$ and a thickness of 0.1 µm. The active layer 104 is formed of a multiple quantum well (MQW) layer. In the first embodiment, a 3-period multiple quantum well layer is used as the active layer 104. The active layer 104 is composed of a well layer made of In$_{0.15}$Ga$_{0.85}$N and having a thickness of 3 nm and a barrier layer made of In$_{0.01}$Ga$_{0.99}$N and having a thickness of 4 nm. The p-type GaN guide layer 105 is made of Mg-doped p-type GaN with an Mg concentration of $2\times10^{19}$ cm$^{-3}$ and a thickness of 0.1 µm. The p-type cladding layer 107 is made of Mg-doped p-type Al$_{0.1}$Ga$_{0.9}$N with an Mg concentration of $1\times10^{19}$ cm$^{-3}$ and a thickness of 0.5 µm. The p-type contact layer 108 is made of Mg-doped p-type GaN with an Mg concentration of $1\times10^{20}$ cm$^{-3}$ and a thickness of 0.02 µm.

Figure 2:
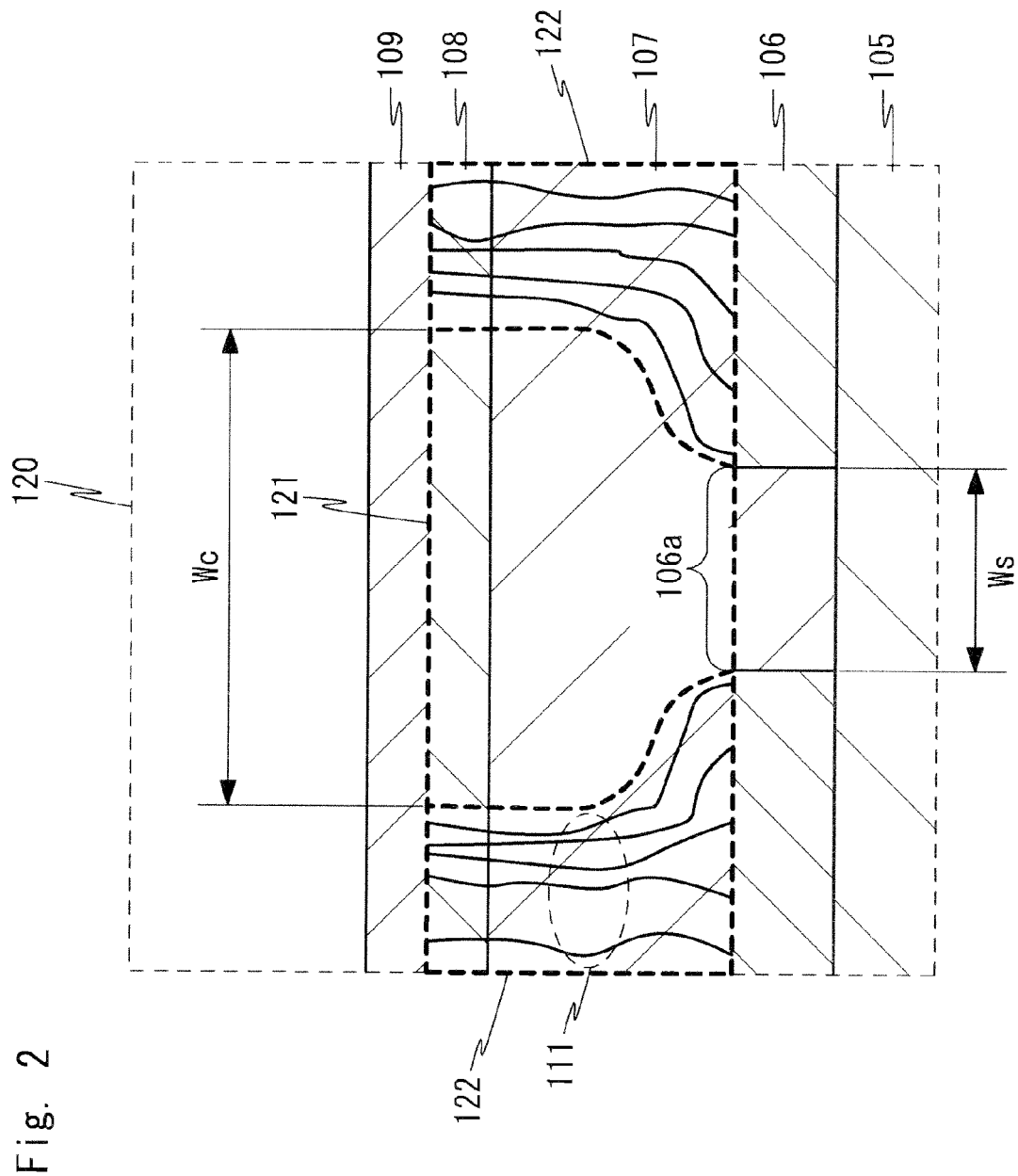
FIG. 2 is an enlarged sectional view of an internal portion enclosed by a dashed box 120 shown in FIG. 1.

FIG. 2 is an enlarged sectional view of an internal portion enclosed by a dashed box 120 shown in FIG. 1. As shown in FIG. 2, dislocations 111 occur from the upper portion of the current constriction layer 106 and reach the p-type electrode 109 through the p-type cladding layer 107 and the p-type contact layer 108. The density of the dislocations 111 is 100 times as high as the dislocation density of each of the n-type GaN substrate 101 and crystal growth layers formed by inheriting the crystal information of the n-type GaN substrate 101. The n-type cladding layer 102, the n-type GaN guide layer 103, the active layer 104, and the p-type GaN guide layer 105 shown in FIG. 1 correspond to the crystal growth layers formed by inheriting the crystal information of the n-type GaN substrate 101.

A region of the p-type cladding layer 107 and the p-type contact layer 108, which is centered on a region immediately above the opening 106*a*, is referred to as a low dislocation density region 121. A region of the p-type cladding layer 107 and the p-type contact layer 108, which is centered on a region immediately above the current constriction layer 106, is referred to as a high dislocation density region 122.

The dislocations 111 are bent in the p-type cladding layer 107. Accordingly, a width We of the low dislocation density region 121 in the p-type contact layer 108 is greater than a width Ws of the low dislocation density region 121 formed at the opening 106*a*. That is, the low dislocation density region 121 overrides the high dislocation density region 122 in the vicinity of the opening 106*a*.

Subsequently, a method for manufacturing the semiconductor laser 100 will be described. FIGS. 3A to 3G are sectional views each schematically showing a process for manufacturing the semiconductor laser 100. First, the n-type GaN substrate 101 is prepared. After that, semiconductor layers are stacked on the n-type GnN substrate 101 by using a low-pressure MOVPE apparatus having a pressure of 300 hPa, for example. In this case, a mixed gas of hydrogen and nitrogen is used as a carrier gas. TrimethylgAllium (TMG), trimethylaluminium (TMA), and trimethylindium (TMI) are used as a Ga source, an Al source, and an In source, respectively. Silane (SiH$_4$) is used as an n-type dopant and bis(cyclopentadienyl) magnesium (Cp$_2$Mg) is used as a p-type dopant.

Figure 3A:
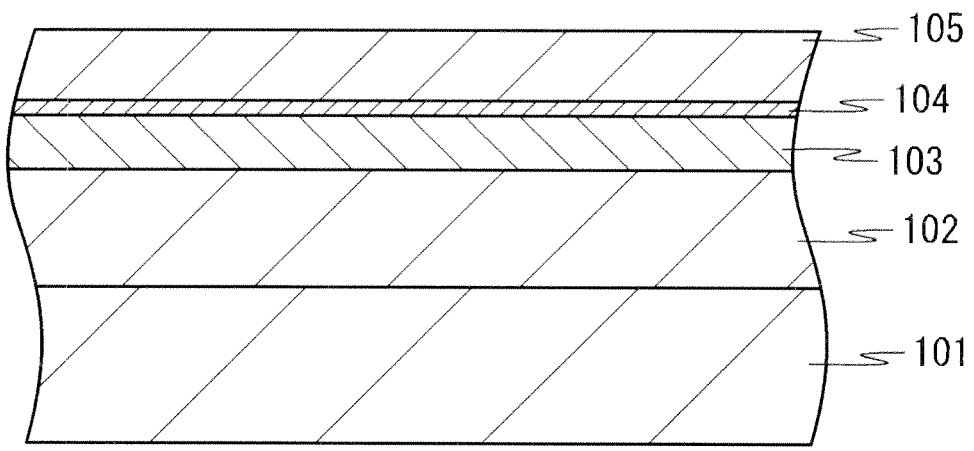
FIG. 3A is a sectional view schematically showing a process for manufacturing the semiconductor laser 100 according to the first embodiment.

After the n-type GaN substrate 101 is loaded into the low-pressure MOVPE apparatus, the temperature of the n-type GaN substrate 101 is increased while NH$_3$ is supplied. When the temperature reaches a growth temperature, a crystal growth is started. Thus, the n-type cladding layer 102, the n-type GaN guide layer 103, the active layer 104, and the p-type GaN guide layer 105 are sequentially deposited (FIG. 3A).

Exemplary conditions for this crystal growth are given below. As conditions for GaN growth, the substrate temperature is 1080° C.; the TMG feed rate is 58 µmol/min; and the NH$_3$ feed rate is 0.36 mol/min. As conditions for AlGaN growth, the substrate temperature is 1080° C.; the TMA feed rate is 36 µmol/min; the TMG feed rate is 58 µmol/min; and the NH$_3$ feed rate is 0.36 mol/min. As conditions for active layer growth, the substrate temperature is 800° C.; the TMG feed rate is 8 µmol/min; and the NH$_3$ feed rate is 0.36 mol/min. The TMI feed rate is 48 µmol/min at the time of growth of the well layer and is 3 µmol/min at the time of growth of the barrier layer.

Figure 3B:
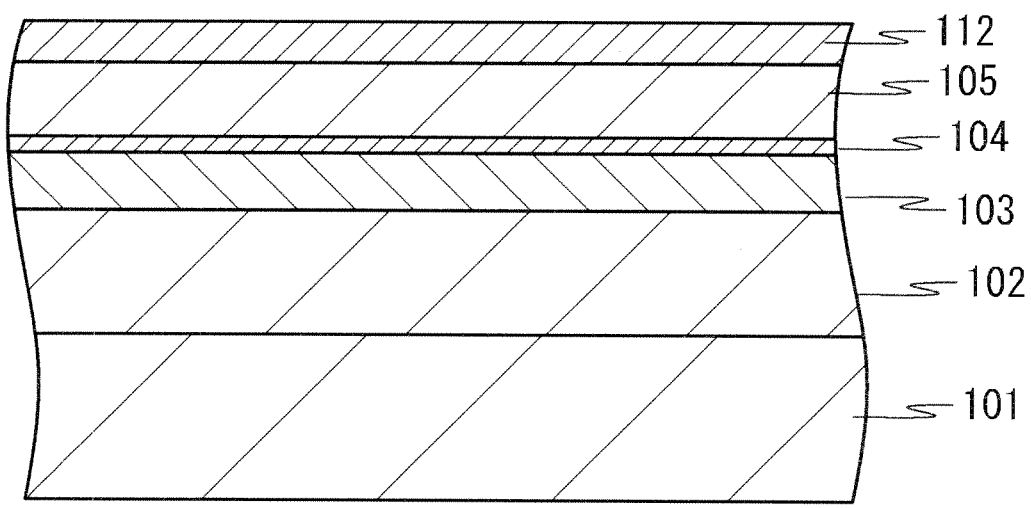
FIG. 3B is a sectional view schematically showing a process for manufacturing the semiconductor laser 100 according to the first embodiment.

After that, a low temperature AlN layer 112 is deposited to form the current constriction layer 106. As growth conditions for the low temperature AlN layer 112, the substrate temperature is 400° C.; the TMA feed rate is 36 µmol/min; and the NH$_3$ feed rate is 0.36 mol/min. The thickness of the deposited layer is 0.1 µm. After the growth of the p-type GaN guide layer 105, the substrate temperature is decreased from 1080° C. to 400° C. to start growing and depositing the low temperature AlN layer 112 (FIG. 3B).

Figure 3C:
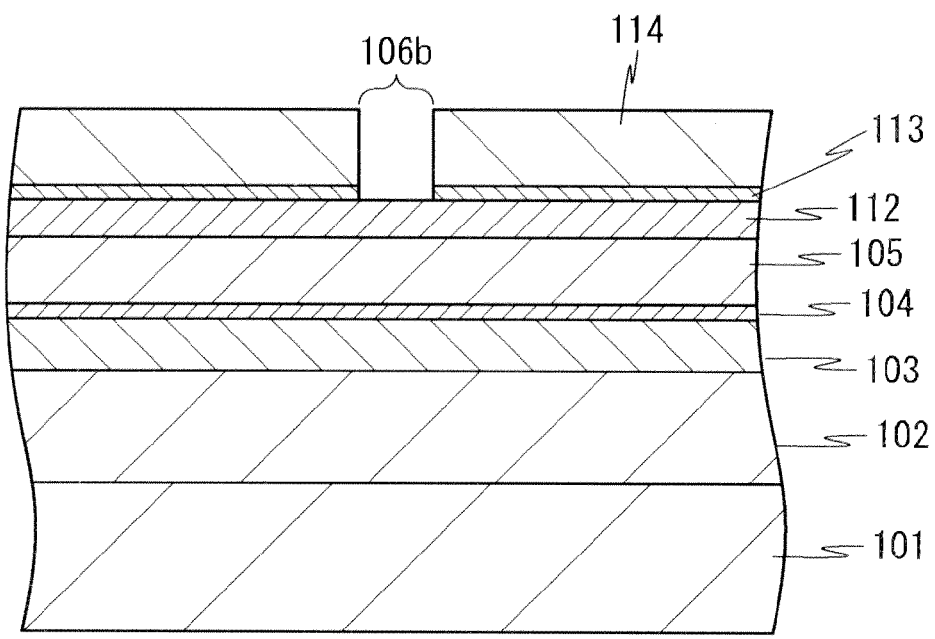
FIG. 3C is a sectional view schematically showing a process for manufacturing the semiconductor laser 100 according to the first embodiment.

Next, the opening 106*a* is formed in the low temperature AlN layer 112. Specifically, an SiO$_2$ (oxide silicon) layer 113 having a thickness of 100 nm is deposited on the low temperature AlN layer 112. Further, a resist is applied to the low temperature AlN layer 112, and a band-like pattern having a width of 2 µm is then formed on a resist 114 by photolithography. Note that the longitudinal direction of the band-like pattern corresponds to the vertical direction with respect to the plane of FIG. 3C. Next, the SiO$_2$ film 113 is etched with the resist 114 as a mask by using buffered hydrofluoric acid, for example. As a result, the band-like opening 106*b* is formed in the SiO$_2$ film 113 (FIG. 3C).

Figure 3D:
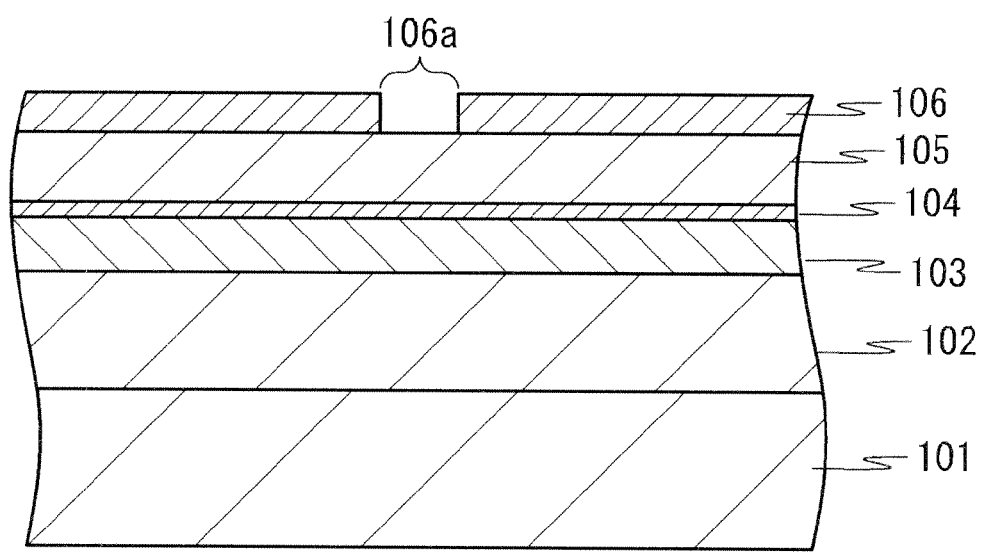
FIG. 3D is a sectional view schematically showing a process for manufacturing the semiconductor laser 100 according to the first embodiment.

After the resist 114 is removed, wet etching is performed using the SiO$_2$ film 113 as a mask, thereby etching the low temperature AlN layer 112. A mixed solution of phosphoric acid and sulfuric acid at a volume ratio of 1:1, for example, is used as an etchant. The low temperature AlN layer 112 is immersed in the etchant held at the temperature of 80° C. for 10 minutes, thereby removing a portion of the low temperature AlN layer 112 in the region which is not masked by the SiO$_2$ film 113. After that, the SiO$_2$ film 113 used as a mask is removed using buffered hydrofluoric acid, thereby forming the opening 106*a*. Note that the low temperature AlN layer 112 remaining after etching serves as the current constriction layer 106 (FIG. 3D).

Next, the p-type cladding layer 107 and the p-type contact layer 108 are deposited using an MOVPE apparatus, for example. Specifically, the temperature is increased to 1100° C. at an NH$_3$ feed rate of 0.36 mol/min, and the p-type cladding layer 107 is deposited. In this case, as growth conditions for the p-type cladding layer 107, the substrate temperature is 1100° C.; the TMA feed rate is 6.3 µmol/min; the TMG feed rate is 10 µmol/min; and the NH$_3$ feed rate is 0.36 mol/min. In this case, the growth rate is 0.4 um/h in the region where the current constriction layer 106 is not present, specifically, in the opening 106*a*, for example. Then, the temperature is decreased to 1080° C., and the p-type contact layer 108 is deposited. In this case, as growth conditions for the p-type contact layer 108, the substrate temperature is 1080° C.; the TMG feed rate is 10 µmol/min; and the NH$_3$ feed rate is 0.36 mol/min.

When the p-type cladding layer 107 is formed in this manner, the dislocations 111 extending upward from the current constriction layer 106 are bent and concentrated in the high dislocation density region 122. The reason why the low dislocation density region 121 and the high dislocation density region 122 are formed will be described below.

The crystal growth on the current constriction layer 106 formed of the low temperature AlN layer is similar to a growth using a so-called low-temperature deposited buffer layer. In this case, minute crystal growth nuclei having a six-sided pyramid shape are first formed on the surface of the current constriction layer 106. The growth nuclei are combined by lateral growth and thus are planarized. After the planarization, a step flow growth is carried out. Meanwhile, on the p-type GaN guide layer 105 exposed through the opening 106a, a step flow growth is carried out immediately after the start of the growth.

Figure 3E:
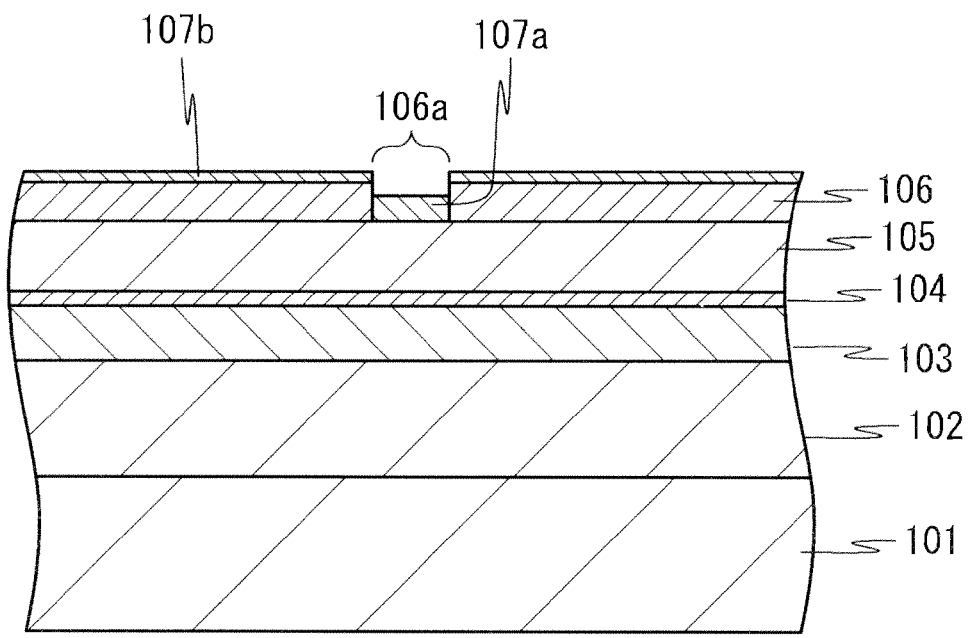
FIG. 3E is a sectional view schematically showing a process for manufacturing the semiconductor laser 100 according to the first embodiment.

In this case, raw materials on the surface of the current constriction layer 106 are not used before the crystal growth nuclei are formed on the surface of the current constriction layer 106. Accordingly, the effective feed rate of raw materials into the opening 106a increases, and the growth rate of the p-type cladding layer 107 formed on the opening 106a increases. On the surface of the current constriction layer 106, the raw materials are also used for the lateral growth during the period from the formation of the crystal growth nuclei to the planarization. Accordingly, the longitudinal growth rate on the surface of the current constriction layer 106 is lower than that of the step flow growth. For this reason, in the initial growth, the growth rate of a p-type cladding layer 107a formed in a region above the opening 106a is higher than the growth rate of a p-type cladding layer 107b formed in a region above the current constriction layer 106 (FIG. 3E). After a lapse of a certain period of time from the start of the growth, the growth rates of the p-type cladding layers 107a and 107b are stabilized at an equal value.

Figure 3F:
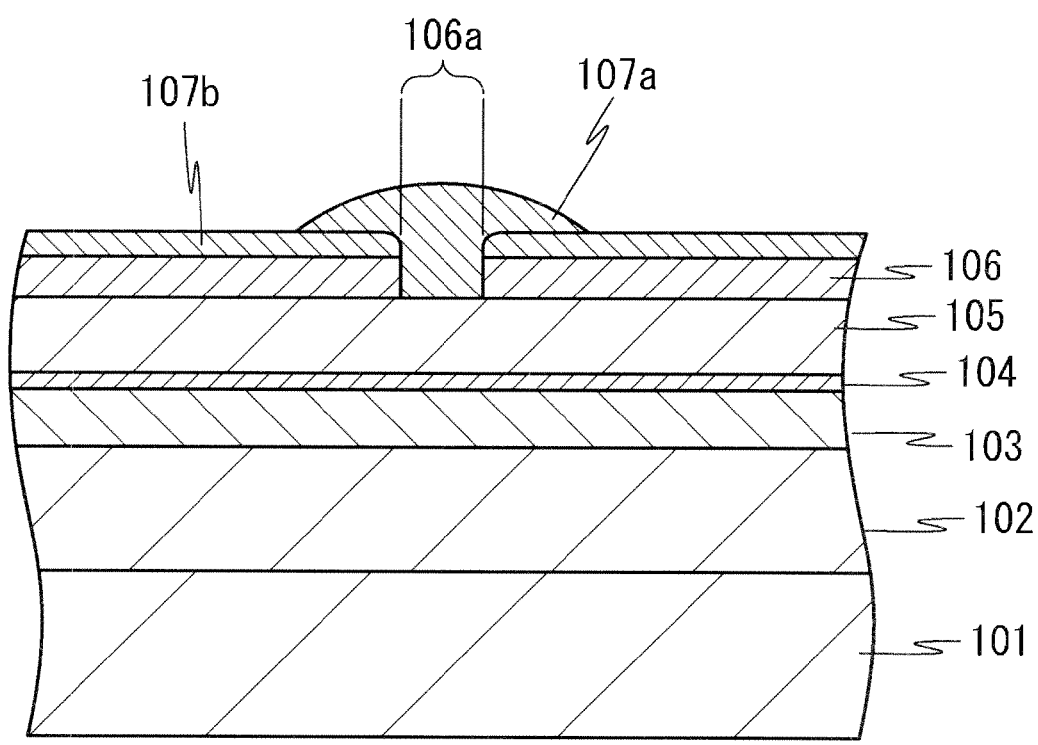
FIG. 3F is a sectional view schematically showing a process for manufacturing the semiconductor laser 100 according to the first embodiment.

The difference between the growth rate during the initial growth on the opening 106a and that on the current constriction layer 106 becomes more remarkable under conditions of a high growth temperature at which lateral growth is liable to occur and a low growth rate at which the feed rate of raw materials is low. In particular, when the growth temperature of the p-type cladding layer 107 is 1100° C. or higher, or when the growth rate of the p-type cladding layer 107 after the stabilization is 0.5 um/h or less, the difference in growth rate during the initial growth is extremely large. Accordingly, during the period from the formation of the crystal growth nuclei on the current constriction layer 106 to the start of the step flow growth, the p-type cladding layer 107a in the region above the opening 106a is formed to rise from the p-type cladding layer 107b in the region above the current constriction layer 106 (FIG. 3F).

Figure 3G:
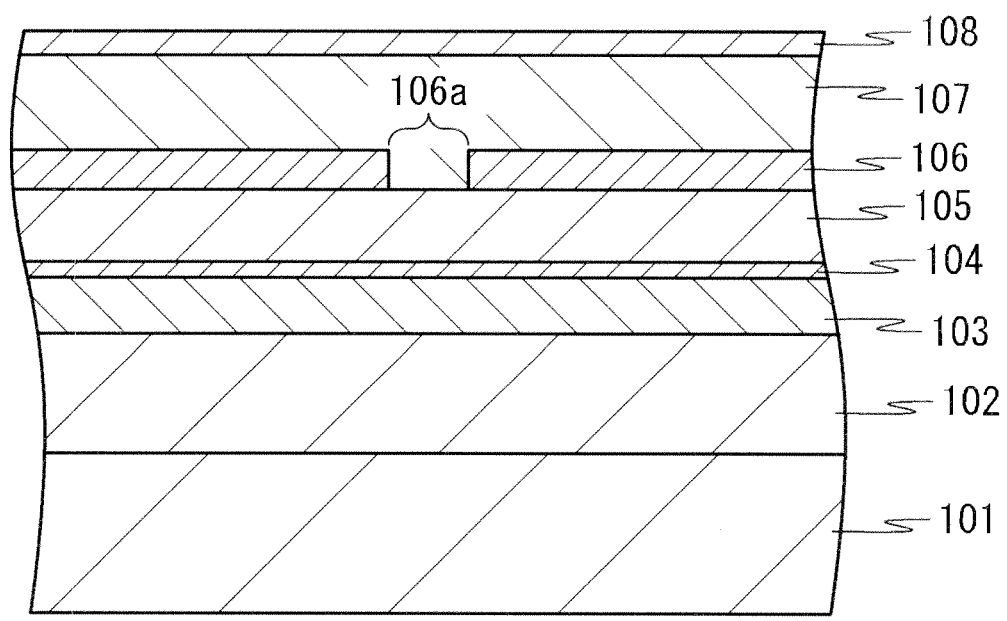
FIG. 3G is a sectional view schematically showing a process for manufacturing the semiconductor laser 100 according to the first embodiment.
Figure 4:
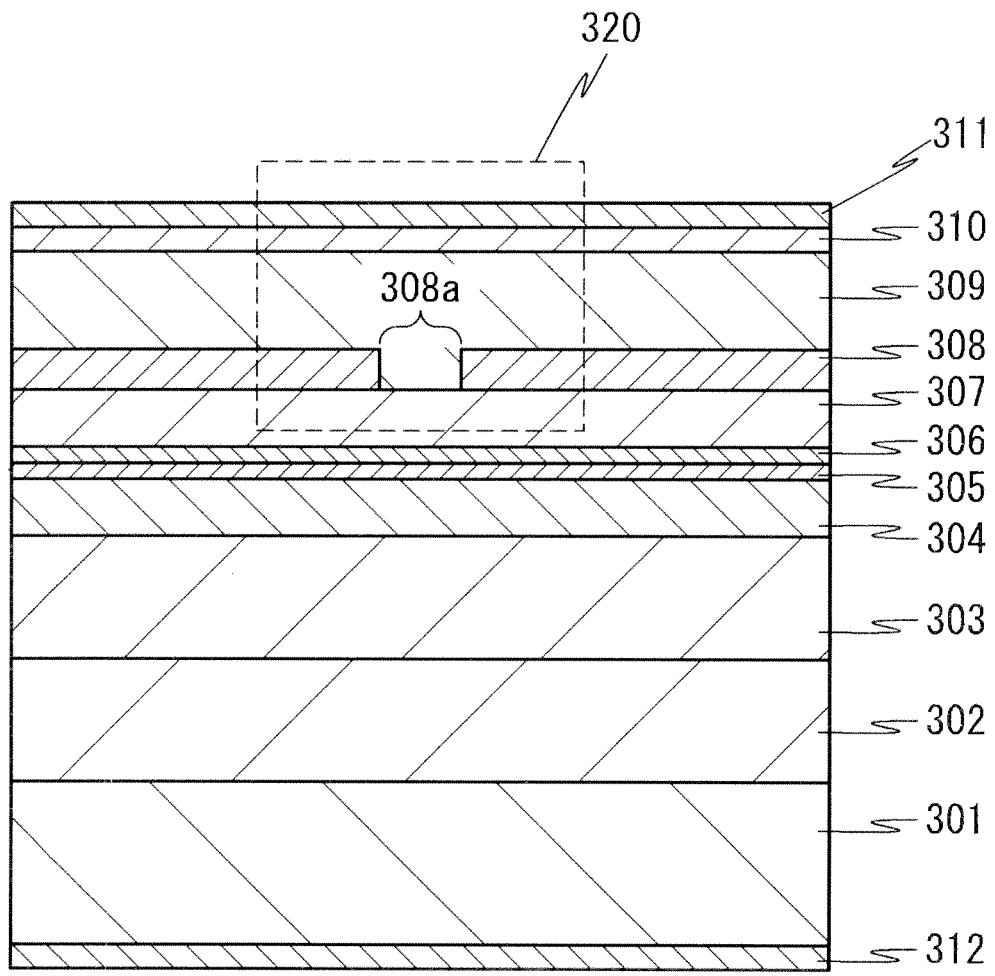
FIG. 4 is a sectional view showing a configuration of a semiconductor laser 300.
Figure 5:
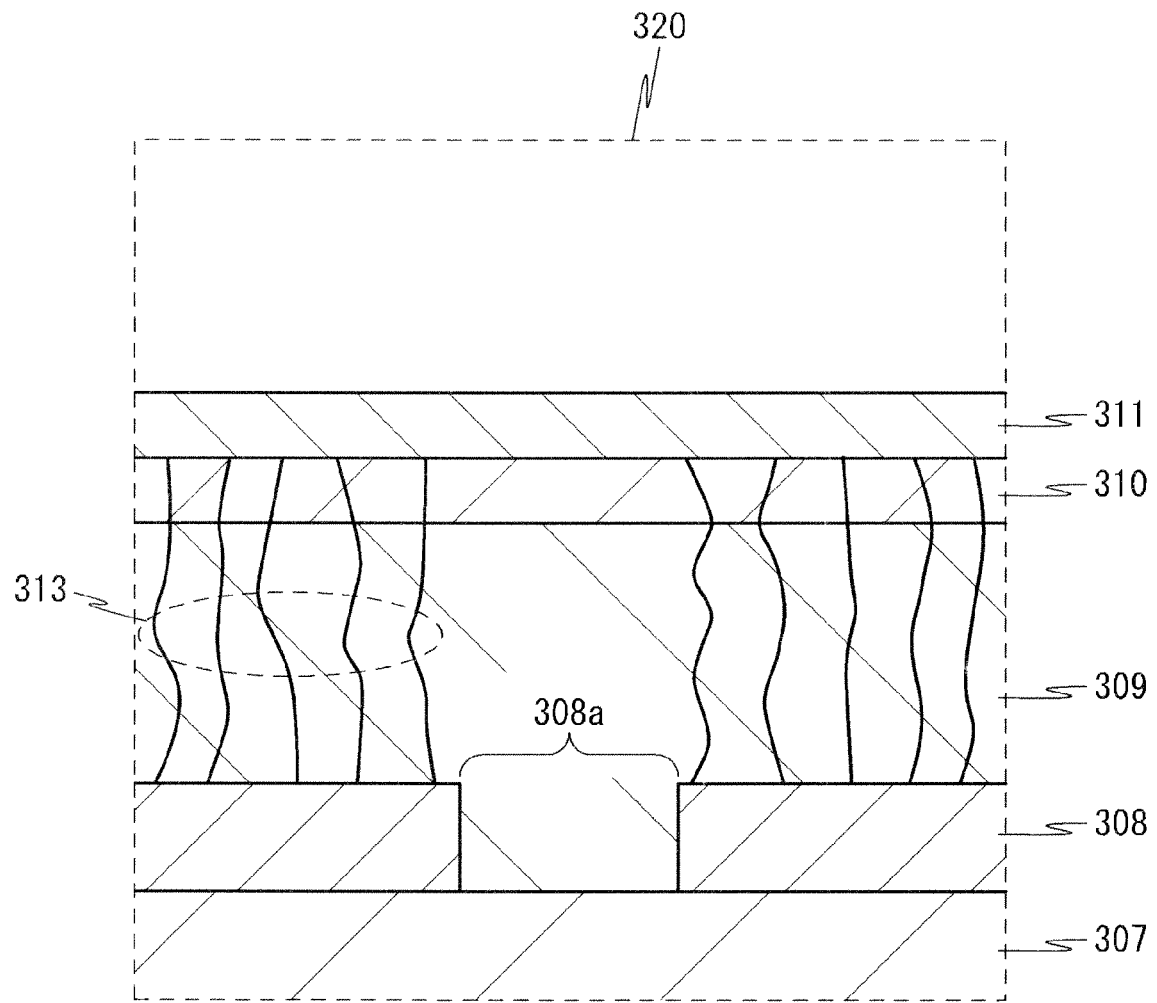
FIG. 5 is an enlarged sectional view of an internal portion enclosed by a dashed box 320 shown in FIG. 4.

As the growth is continued, the p-type cladding layer 107a in the region above the opening 106a is continuously grown in the lateral direction. As a result, the dislocations occurring from the region above the current constriction layer 106 in the vicinity of the opening 106a are bent in the direction away from the opening 106a. After that, the p-type contact layer 108 is formed (FIG. 3G). As a result, as shown in FIG. 2, the width Wc of the low dislocation density region 121 at the p-type contact layer 108 is greater than the width Ws of the low dislocation density region 121 at the opening 106a.

In the first embodiment, as the growth rate of the p-type cladding layer 107 after the stabilization decreases, or as the growth temperature of the p-type cladding layer 107 increases, the width Wc of the low dislocation density region 121 at the p-type contact layer 108 increases. Considering the manufacturing time, however, the growth rate is preferably 0.2 to 0.5 um/h. Further, considering the lifetime of the heater of the MOVPE apparatus, the growth temperature is preferably 1100 to 1200° C.

After that, the p-type electrode 109 and the n-type electrode 110 are formed using a known technique. Specifically, Ti is formed by vacuum evaporation on the back surface of the n-type GaN substrate 101 with a thickness of 5 nm, and Al is then formed thereon by vacuum evaporation with a thickness of 20 nm. Further, Ni is formed by vacuum evaporation on the p-type contact layer 108 with a thickness of 10 nm, and Au is then formed thereon by vacuum evaporation with a thickness of 10 nm. A wafer obtained after the vacuum evaporation described above is loaded into an RTA apparatus, and alloying is carried out at 600° C./30 sec to form an ohmic contact. After that, Au is formed by vacuum evaporation with a thickness of 500 nm on the Ti/Al layer on the back surface side of the n-type GaN substrate 101 and on the Ni/Au layer on the front surface side of the n-type GaN substrate 101. As a result, the p-type electrode 109 and the p-type electrode 110 are formed. After the formation of the p-type electrode 109 and the p-type electrode 110, the wafer is cleaved such that the device length in the vertical direction of the stripe (the vertical direction in the plane of the figure) becomes 500 μm, for example, thereby obtaining the semiconductor laser 100.

A sample with a thickness of 50 nm was extracted from the vicinity of the opening 106a of the semiconductor laser 100 produced by the above-mentioned manufacturing method, and the sample was observed with a transmission electron microscope. As a result, dislocations at a high density of $1\times10^{10}$ to $1\times10^{12}$ cm$^{-2}$ were present in the current constriction layer 106, and the dislocations 111 propagated from the region above the current constriction layer 106 at the same density were present also in the p-type cladding layer 107 formed on the current constriction layer 106. The dislocations 111 occurring from the region above the current constriction layer 106 in the vicinity of the opening 106a were bent in the direction away from the opening 106a during the propagation through the p-type cladding layer 107. Thus, the high dislocation density region 122 was formed.

On the other hand, it has turned out that dislocations introduced from the surface of the p-type GaN guide layer 105, which is a regrown interface, are not present in the p-type cladding layer 107 formed on the opening 106a, that is, in the low dislocation density region 121.

In the first embodiment, the free-standing GaN substrate having a low dislocation density ($5\times10^{6}$ cm$^{-1}$) is used as the n-type GaN substrate 101. Accordingly, threading dislocations propagated from the n-type GaN substrate 101 can be stochastically present in the low dislocation density region 121. However, no threading dislocation was observed in this observation.

Therefore, according to the semiconductor laser manufacturing method described above, a semiconductor laser having an effective contact width greater than the opening width of the current constriction layer can be obtained. This makes it possible to provide a semiconductor laser with a lower device resistance.

Note that the present invention is not limited to the above embodiment, but may be modified in various manners without departing from the scope of the present invention. For example, the semiconductor laser 100 according to the first embodiment described above may include a cap layer formed between the active layer 104 and the p-type GaN guide layer 105, as with the semiconductor laser 300.

The element composition ratio and thickness of the semiconductor layers of the semiconductor laser 100, that is, the n-type GaN substrate 101, the n-type cladding layer 102, the n-type GaN guide layer 103, the active layer 104, p-type GaN guide layer 105, the current constriction layer 106, the p-type cladding layer 107, and the p-type contact layer 108, are illustrative only. Accordingly, the element composition ratio can be changed as needed as long as the semiconductor laser 100 functions as a semiconductor laser and the operation and effect of the present invention can be achieved.

For example, the current constriction layer 106 made of AlN is illustrated as a layer having a band gap larger than that of the P-type cladding layer 107, but $Al_xGa_{1-x}N$ having a Al composition ratio x higher than that of the P-type cladding layer 107 may also be used. When the current constriction layer 106 is made of $Al_xGa_{1-x}N$ having an Al composition ratio higher than that of the P-type cladding layer 107, the band gap of the current constriction layer 106 can be set to be higher than that of the P-type cladding layer 107. Note that because $Al_xGa_{1-x}N$ having different Al composition ratios have different lattice constants, a problem arises in that a region with a high dislocation density is generated in the same manner as the case where the current constriction layer 106 is made of AlN. However, this problem can also be solved by the technique of the present invention, as in the case where the current constriction layer 106 is made of AlN.

As long as the band gap of the n-type GaN guide layer 103 is narrower than that of the P-type cladding layer 107, $Al_xGa_{1-x}N$ having an Al composition ratio smaller than that of the P-type cladding layer 107 may also be used, for example, in place of the n-type GaN guide layer 103.

The type and concentration of dopants used for the n-type cladding layer 102, the n-type GaN guide layer 103, the p-type GaN guide layer 105, the p-type cladding layer 107, and the p-type contact layer 108 are illustrative only. Therefore, the type and concentration of dopants may be changed as needed as long as the semiconductor laser 100 functions as a semiconductor laser and the operation and effect of the present invention can be achieved.

The structure of the active layer is not limited to the 3-period multiple quantum well structure, but two or three or more multiple quantum well structures or a single quantum well structure may also be used.

Moreover, the conductivity types of the n-type GaN substrate 101, the n-type cladding layer 102, the n-type GaN guide layer 103, the p-type GaN guide layer 105, the current constriction layer 106, the p-type cladding layer 107, and the p-type contact layer 108 are illustrative only. Therefore, the conductivity types may be replaced as needed. Specifically, the p-type and the n-type may be reversed.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The present invention may be summarized as following supplementary notes.

(Supplementary Note 1)

A semiconductor laser manufacturing method comprising:
depositing an active layer above a substrate made of a group-III nitride semiconductor of a first conductivity type;
depositing a guide layer on the active layer, the guide layer being made of a group-III nitride semiconductor of a second conductivity type different from the first conductivity type;
depositing a current constriction layer on the guide layer, the current constriction layer being made of a group-III nitride semiconductor;
forming an opening in the current constriction layer, the guide layer being exposed through the opening;
forming a cladding layer made of a group-III nitride semiconductor of the second conductivity type to bury an upper portion of the current constriction layer and the opening of the current constriction layer; and
forming a contact layer of the second conductivity type on the cladding layer,
wherein in the formation of the cladding layer, the cladding layer is formed such that a first growth rate at a start of growth on the guide layer exposed through the opening becomes greater than a second growth rate at a start of growth on the current constriction layer, and
wherein the current constriction layer has a band gap greater than a band gap of the cladding layer.

(Supplementary Note 2)

The semiconductor laser manufacturing method according to Supplementary note 1, wherein
the cladding layer is made of $Al_xGa_{1-x}N$ having an Al composition ratio x, and
the current constriction layer is made of $Al_yGa_{1-y}N$ having an Al composition ratio y greater than the Al composition ratio x of the cladding layer.

(Supplementary Note 3)

The semiconductor laser manufacturing method according to Supplementary note 1, wherein the guide layer is a semiconductor layer having a band gap narrower than the band gap of the cladding layer.

(Supplementary note 4)

The semiconductor laser manufacturing method according to Supplementary note 1, wherein the guide layer is made of GaN.

What is claimed is:

1. A semiconductor laser manufacturing method comprising:
   depositing an active layer above a GaN substrate of a first conductivity type;
   depositing a first guide layer above the active layer, the first guide layer being made of GaN of a second conductivity type different from the first conductivity type;
   depositing an AlN layer on the first guide layer;
   forming an opening in the AlN layer;
   forming a first cladding layer on the AlN layer and the first guide layer exposed through the opening such that a first growth rate at a start of growth on the first guide layer exposed through the opening is greater than a second growth rate at a start of growth on the AlN layer, the first cladding layer being made of a group-III nitride semiconductor of the second conductivity type; and
   forming a contact layer of the second conductivity type on the first cladding layer.

2. The semiconductor laser manufacturing method according to claim 1, wherein a growth temperature of the first cladding layer is 1100° C. or higher.

3. The semiconductor laser manufacturing method according to claim 2, wherein the growth temperature of the first cladding layer is in a range of 1100° C. to 1200° C.

4. The semiconductor laser manufacturing method according to claim 1, wherein the first growth rate becomes equal to the second growth rate after a lapse of a certain period of time from the start of growth.

5. The semiconductor laser manufacturing method according to claim 4, wherein a growth rate of the first cladding layer is 0.5 um/h or less.

6. The semiconductor laser manufacturing method according to claim 5, wherein the growth rate of the first cladding layer is in a range of 0.2 um/h to 0.5 um/h.

7. The semiconductor laser manufacturing method according to claim 1, wherein
the AlN layer is a low-temperature deposited buffer layer, and a growth temperature of the AlN layer is lower than a growth temperature of the first cladding layer.

8. The semiconductor laser manufacturing method according to claim 7, wherein the growth temperature of the AlN layer is 400° C.

9. The semiconductor laser manufacturing method according to claim 1, wherein the AlN layer excluding the opening functions as a current constriction layer.

10. The semiconductor laser manufacturing method according to claim 1, wherein the first cladding layer is made of AlGaN.

11. The semiconductor laser manufacturing method according to claim 1, wherein the contact layer is made of GaN.

12. The semiconductor laser manufacturing method according to claim 1, further comprising:
 depositing a second cladding layer of the first conductivity type on the GaN substrate prior to the deposition of the active layer; and
 depositing a second guide layer of the first conductivity type.

13. The semiconductor laser manufacturing method according to claim 12, wherein
 the second cladding layer is made of AlGaN, and
 the second guide layer is made of GaN.

* * * * *